(12) United States Patent  (10) Patent No.: US 9,143,085 B2
Narathong et al.  (45) Date of Patent: Sep. 22, 2015

(54) FREQUENCY SYNTHESIZER ARCHITECTURE IN A TIME-DIVISION DUPLEX MODE FOR A WIRELESS DEVICE

(71) Applicant: QUALCOMM Incorporated, San Diego, CA (US)

(72) Inventors: Chiewcharn Narathong, Laguna Niguel, CA (US); Lai Kan Leung, San Marcos, CA (US); Soon-Seng Lau, San Diego, CA (US); Shrenik Patel, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 267 days.

(21) Appl. No.: 13/765,992

(22) Filed: Feb. 13, 2013

(65) Prior Publication Data

US 2013/0229954 A1  Sep. 5, 2013

Related U.S. Application Data

(60) Provisional application No. 61/605,285, filed on Mar. 1, 2012.

(51) Int. Cl.
| H03B 28/00 | (2006.01) |
| H04B 1/403 | (2015.01) |
| H04B 1/408 | (2015.01) |
| H04B 1/04 | (2006.01) |

(52) U.S. Cl.
CPC ............... *H03B 28/00* (2013.01); *H04B 1/406* (2013.01); *H04B 1/408* (2013.01); *H04B 1/0475* (2013.01)

(58) Field of Classification Search
None
See application file for complete search history.

(56) References Cited

U.S. PATENT DOCUMENTS

| 5,319,799 | A | 6/1994 | Morita |
| 5,715,520 | A | 2/1998 | Hillock et al. |
| 6,075,996 | A * | 6/2000 | Srinivas ..................... 455/552.1 |
| 6,198,820 | B1 * | 3/2001 | Tetsushi ....................... 379/413 |
| 6,343,071 | B1 * | 1/2002 | Lansford ...................... 370/338 |
| 6,356,770 | B1 * | 3/2002 | Ishida ......................... 455/553.1 |
| 6,411,660 | B1 * | 6/2002 | Oh ................................ 375/327 |
| 7,003,274 | B1 * | 2/2006 | Olip ............................. 455/260 |
| 7,027,796 | B1 * | 4/2006 | Linsky et al. .............. 455/343.1 |
| 7,519,332 | B1 | 4/2009 | Suematsu |
| 2005/0040894 | A1 * | 2/2005 | Heinonen et al. .............. 331/11 |
| 2005/0064828 | A1 * | 3/2005 | Kurakami et al. ......... 455/115.1 |

(Continued)

OTHER PUBLICATIONS

International Search Report and Written Opinion—PCT/US2013/028398—ISA/EPO—Oct. 15, 2013.

(Continued)

*Primary Examiner* — Jae Y Lee
*Assistant Examiner* — Andrew Oh
(74) *Attorney, Agent, or Firm* — Kevin T. Cheatham

(57) ABSTRACT

A dual frequency synthesizer architecture for a wireless device operating in a time division duplex (TDD) mode is disclosed. In an exemplary design, the wireless device includes first and second frequency synthesizers. The first frequency synthesizer generates a first oscillator signal used to generate a first/receive local oscillator (LO) signal at an LO frequency for the receiver. The second frequency synthesizer generates a second oscillator signal used to generate a second/transmit LO signal at the same LO frequency for the transmitter. The two frequency synthesizers generate their oscillator signals to obtain receive and transmit LO signals at the same LO frequency when the wireless device operates in the TDD mode.

47 Claims, 12 Drawing Sheets

(56) References Cited

U.S. PATENT DOCUMENTS

| | | | |
|---|---|---|---|
| 2005/0078615 A1* | 4/2005 | Muri | 370/277 |
| 2005/0116781 A1* | 6/2005 | Yamamoto et al. | 331/2 |
| 2005/0239417 A1* | 10/2005 | Boos | 455/86 |
| 2005/0250452 A1* | 11/2005 | Walton et al. | 455/63.4 |
| 2006/0046672 A1* | 3/2006 | Kalhan et al. | 455/177.1 |
| 2006/0089107 A1* | 4/2006 | Domino et al. | 455/78 |
| 2006/0092008 A1* | 5/2006 | Corrington et al. | 340/505 |
| 2006/0226916 A1* | 10/2006 | Florescu et al. | 331/16 |
| 2006/0245518 A1* | 11/2006 | Wang | 375/316 |
| 2008/0003968 A1* | 1/2008 | Li | 455/255 |
| 2009/0093223 A1* | 4/2009 | McCune, Jr. | 455/126 |
| 2009/0130989 A1* | 5/2009 | Rousu et al. | 455/73 |
| 2009/0174486 A1* | 7/2009 | Haralabidis et al. | 331/45 |
| 2009/0302963 A1* | 12/2009 | Ballantyne et al. | 332/105 |
| 2010/0029239 A1* | 2/2010 | Asuri | 455/333 |
| 2010/0046693 A1* | 2/2010 | Ellersick | 377/47 |
| 2010/0118744 A1* | 5/2010 | Kwon et al. | 370/278 |
| 2011/0026613 A1* | 2/2011 | Mari et al. | 375/259 |
| 2011/0128992 A1* | 6/2011 | Maeda et al. | 375/130 |
| 2011/0223874 A1* | 9/2011 | Callaway et al. | 455/115.3 |
| 2012/0263215 A1* | 10/2012 | Peng | 375/221 |
| 2013/0003626 A1* | 1/2013 | Husted et al. | 370/311 |
| 2013/0058388 A1* | 3/2013 | Muhammad | 375/222 |
| 2013/0078948 A1* | 3/2013 | Pecen et al. | 455/411 |
| 2013/0176913 A1* | 7/2013 | Niskanen et al. | 370/278 |
| 2013/0195151 A1* | 8/2013 | Miller et al. | 375/219 |

OTHER PUBLICATIONS

Partial International Search Report—PCT/US2013/028398—International Search Authority European Patent Office Jul. 1, 2013.

* cited by examiner

FREQUENCY SYNTHESIZER ARCHITECTURE IN A TIME-DIVISION DUPLEX MODE FOR A WIRELESS DEVICE

RELATED APPLICATIONS

This application is related to and claims priority from U.S. Provisional Patent Application Ser. No. 61/605,285 filed Mar. 1, 2012, for "FREQUENCY SYNTHESIZER ARCHITECTURE FOR A WIRELESS DEVICE."

BACKGROUND

I. Field

The present disclosure relates generally to electronics, and more specifically to a frequency synthesizer architecture for a wireless device.

II. Background

A wireless device (e.g., a cellular phone or a smart phone) may transmit and receive data for two-way communication with a wireless communication system. The wireless device may include a transmitter for data transmission and a receiver for data reception. For data transmission, the transmitter may modulate a transmit local oscillator (LO) signal with data to obtain a modulated radio frequency (RF) signal, amplify the modulated RF signal to obtain an output RF signal having the proper output power level, and transmit the output RF signal via an antenna to a base station. For data reception, the receiver may obtain a received RF signal via the antenna, amplify and downconvert the received RF signal with a receive LO signal, and process the downconverted signal to recover data sent by the base station.

The wireless device may include a frequency synthesizer to generate the receive LO signal for the receiver and the transmit LO signal for the transmitter. The frequency synthesizer may have a large impact on the performance of the receiver and the transmitter.

SUMMARY

A dual frequency synthesizer architecture for a wireless device operating in a time division duplex (TDD) mode is disclosed herein. The dual frequency synthesizer architecture may also be used for a frequency division duplex (FDD) mode. For TDD, the downlink and uplink share the same frequency, and two frequency synthesizers may be used to generate two LO signals at the same frequency for a receiver and a transmitter. For FDD, the downlink and uplink are allocated separate frequencies, and the two frequency synthesizers may be used to generate two LO signals at different frequencies for the receiver and the transmitter.

In an exemplary design, the wireless device includes first and second frequency synthesizers. The first frequency synthesizer generates a first oscillator signal used to generate a first/receive LO signal at an LO frequency for a receiver. The second frequency synthesizer generates a second oscillator signal used to generate a second/transmit LO signal at the same LO frequency for a transmitter. For example, each oscillator signal may be divided in frequency by a divider and buffered to obtain a corresponding LO signal. The first and second frequency synthesizers generate their oscillator signals to obtain receive and transmit LO signals at the same LO frequency when the wireless device operates in the TDD mode. The first and second frequency synthesizers generate their oscillator signals to obtain receive and transmit LO signals at different LO frequencies when the wireless device operates in the FDD mode.

In one design, the first and second frequency synthesizers generate the first and second oscillator signals at the same oscillator frequency in the TDD mode, and the same frequency divider ratio may be used for the first and second oscillator signals to obtain the receive and transmit LO signals at the same LO frequency. In another design, the first and second frequency synthesizers generate the first and second oscillator signals at different oscillator frequencies in the TDD mode, and different frequency divider ratios may be used for the first and second oscillator signals to obtain the receive and transmit LO signals at the same LO frequency.

In one design, the first and second frequency synthesizers may operate at their target oscillator frequencies all the time. In another design, each frequency synthesizer may operate (i) at its target oscillator frequency when its associated receiver or transmitter is enabled and (ii) at an offset from its target oscillator frequency when its associated receiver or transmitter is disabled in order to reduce disturbance to the other frequency synthesizer. The first and second frequency synthesizers may be enabled and disabled in various manners, as described below.

Using separate frequency synthesizers for the receiver and transmitter in the TDD mode may provide various advantages such as fewer and/or smaller buffers, lower power consumption, less complicated signal routing, improved performance, etc., as described below.

Various aspects and features of the disclosure are described in further detail below.

DETAILED DESCRIPTION

Figure 1:
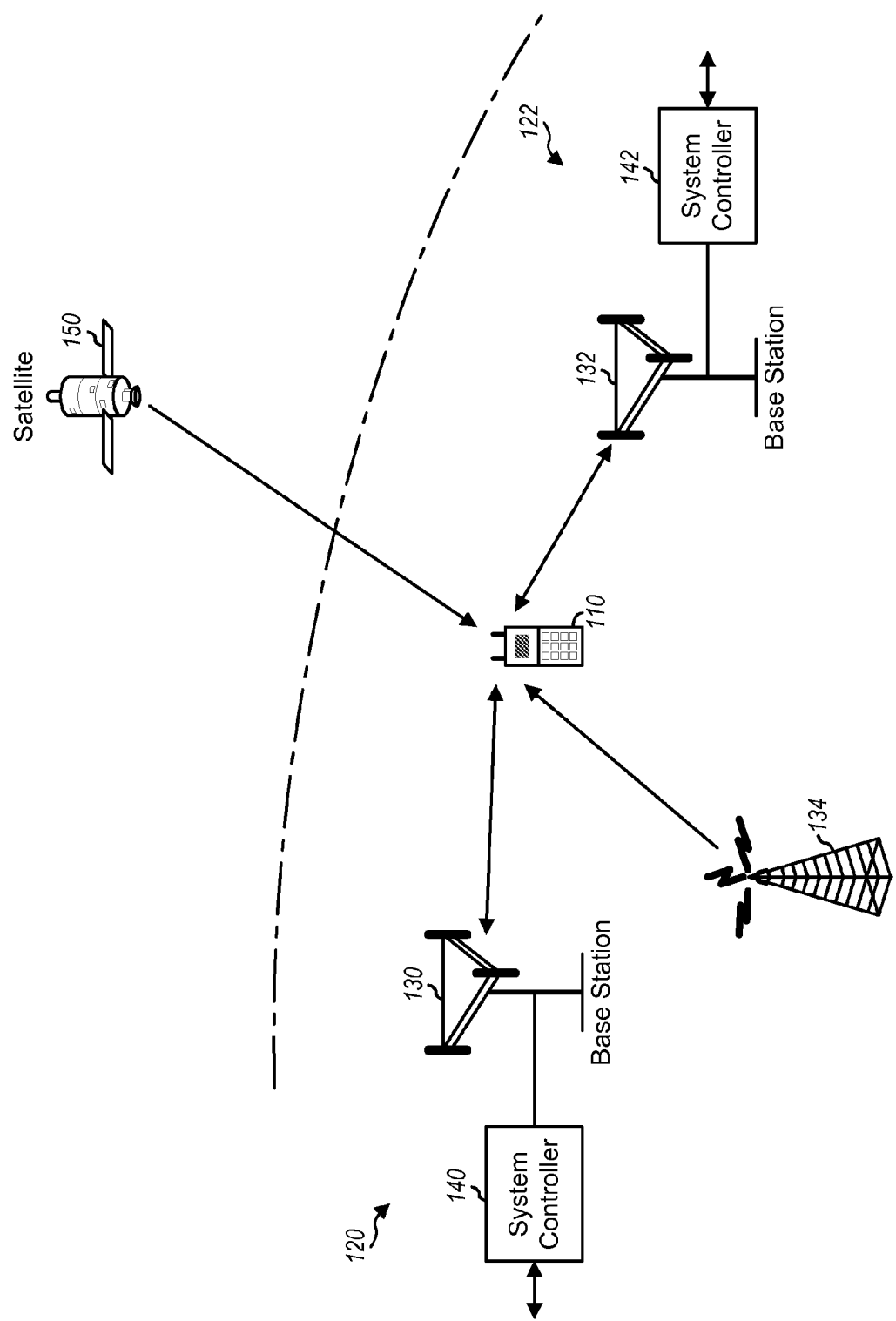
FIG. 1 shows a wireless device capable of communicating with different wireless communication systems.

FIG. 1 shows a wireless device 110 capable of communicating with different wireless communication systems 120 and 122. Wireless systems 120 and 122 may each be a Code Division Multiple Access (CDMA) system, a Global System for Mobile Communications (GSM) system, a Long Term Evolution (LTE) system, a wireless local area network (WLAN) system, or some other wireless system. For example, wireless systems 120 and 122 may be an LTE system and may include LTE frequency division duplexing (FDD) or an LTE time division duplexing (TDD). For instance, a system may be an LTE TDD system. A CDMA system may implement Time Division Synchronous Code Division Multiple Access (TD-SCDMA), Wideband CDMA (WCDMA), cdma2000, or some other version of CDMA. TD-SCDMA is also referred to as Universal Terrestrial Radio Access (UTRA) Time Division Duplex (TDD) 1.28 Mcps Option or Low Chip Rate (LCR). For simplicity, FIG. 1 shows wireless system 120 including one base station 130 and one system controller 140, and wireless system 122 including one base station 132 and one system controller 142. In general, each wireless system may include any number of base stations and any set of network entities.

Wireless device 110 may also be referred to as a user equipment (UE), a mobile station, a terminal, an access terminal, a subscriber unit, a station, etc. Wireless device 110 may be a cellular phone, a smart phone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may be capable of communicating with wireless system 120 and/or 122. Wireless device 110 may also be capable of receiving signals from broadcast stations (e.g., a broadcast station 134). Wireless device 110 may also be capable of receiving signals from satellites (e.g., a satellite 150) in one or more global navigation satellite systems (GNSS). Wireless device 110 may support one or more radio technologies for wireless communication such as LTE, TD-SCDMA, WCDMA, cdma2000, GSM, 802.11, etc.

Wireless device 110 may communicate with a base station 130, 132, in a wireless system 120 via the downlink and uplink. The downlink (or forward link) refers to the communication link from the base station to the wireless device, and the uplink (or reverse link) refers to the communication link from the wireless device to the base station.

A wireless system may utilize TDD or FDD. For TDD, the downlink and uplink share the same frequency, and downlink transmissions and uplink transmissions may be sent on the same frequency in different time periods. For FDD, the downlink and uplink are allocated separate frequencies. Downlink transmissions may be sent on one frequency, and uplink transmissions may be sent on another frequency. Some examples of radio technologies supporting TDD include LTE TDD, TD-SCDMA, GSM, etc. Some examples of radio technologies supporting FDD include LTE FDD, WCDMA, cdma2000, etc.

Figure 2:
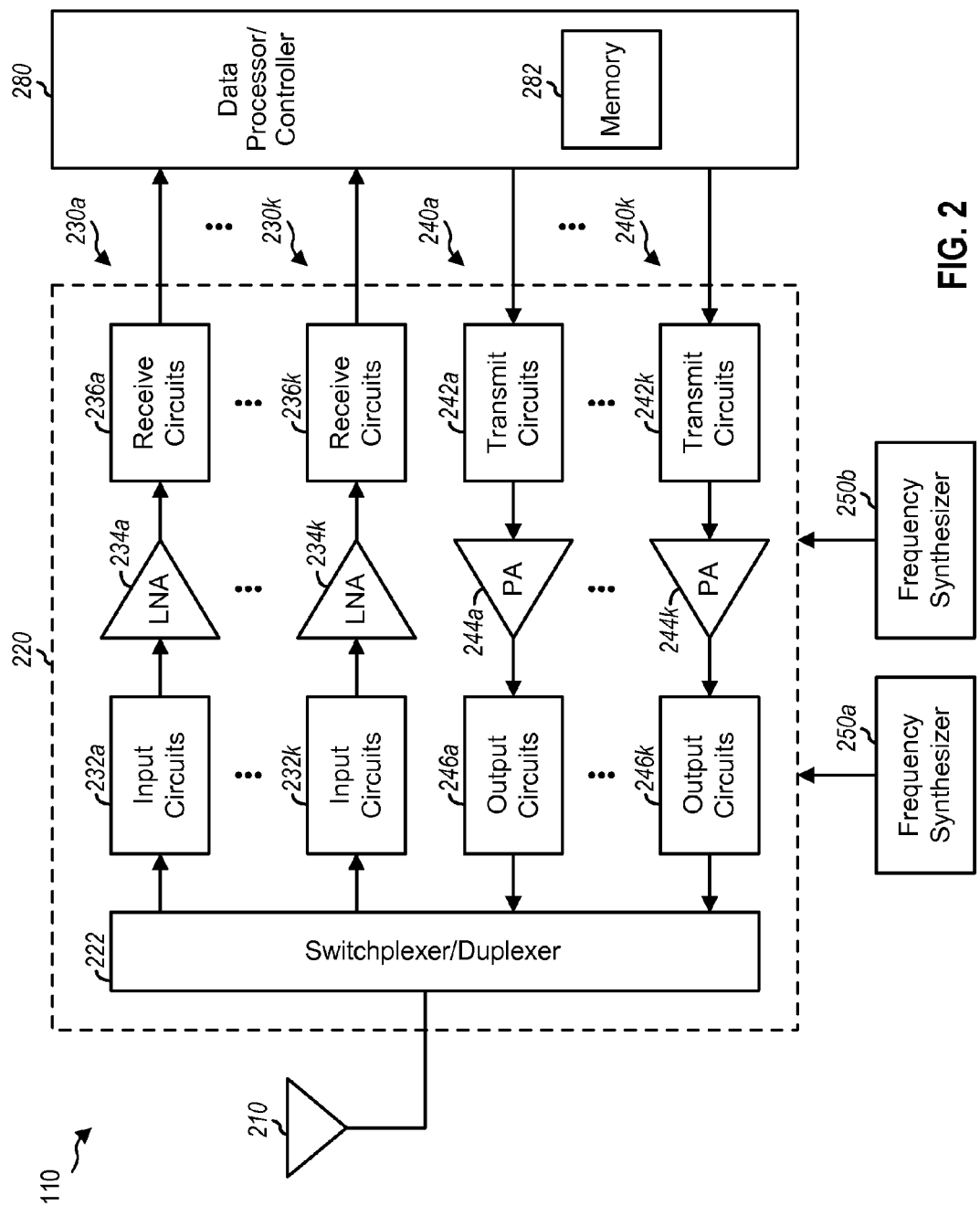
FIG. 2 shows a block diagram of the wireless device in FIG. 1.

FIG. 2 shows a block diagram of an exemplary design of wireless device 110 in FIG. 1. In this exemplary design, wireless device 110 includes a transceiver 220 coupled to an antenna 210, frequency synthesizers 250a and 250b, and a data processor/controller 280. Transceiver 220 includes multiple (K) receivers 230a to 230k and multiple (K) transmitters 240a to 240k to support multiple frequency bands, multiple radio technologies, etc.

In the exemplary design shown in FIG. 2, each receiver 230 includes input circuits 232, a low noise amplifier (LNA) 234, and receive circuits 236. For data reception, antenna 210 receives signals from base stations and/or other transmitter stations and provides a received RF signal, which is routed through a switchplexer/duplexer 222 and provided to a selected receiver. The description below assumes that receiver 230a is the selected receiver. Within receiver 230a, the received RF signal is passed through input circuits 232a and provided to an LNA 234a. Input circuits 232a may include a receive filter, an impedance matching circuit, etc. LNA 234a amplifies the received RF signal from input circuits 232a and provides an amplified RF signal. Receive circuits 236a amplify, filter, and downconvert the amplified RF signal from RF to baseband and provide an analog input signal to data processor 280. Receive circuits 236a may include amplifiers, filters, mixers, impedance matching circuits, etc. Each remaining receiver 230 in transceiver 220 may operate in a similar manner as receiver 230a.

In the exemplary design shown in FIG. 2, each transmitter 240 includes transmit circuits 242a-k, power amplifiers (PA) 244a-k, and output circuits 246a-k. For data transmission, data processor 280 processes (e.g., encodes and modulates) data to be transmitted and provides an analog output signal to a selected transmitter. The description below assumes that transmitter 240a is the selected transmitter. Within transmitter 240a, transmit circuits 242a amplify, filter, and upconvert the analog output signal from baseband to RF and provide a modulated RF signal. Transmit circuits 242a may include amplifiers, filters, mixers, impedance matching circuits, etc. A power amplifier 244a receives and amplifies the modulated RF signal and provides an amplified signal having the proper output power level. The amplified signal is passed through output circuits 246a, routed through switchplexer/duplexer 222, and transmitted via antenna 210. Output circuits 246a may include a transmit filter, an impedance matching circuit, a directional coupler, a duplexer, etc.

Frequency synthesizers 250a and 250b generate LO signals for receivers 230 and transmitters 240. Each frequency synthesizer 250 may include a voltage-controlled oscillator (VCO), a phase locked loop (PLL), buffers, etc.

FIG. 2 shows an exemplary design of receivers 230 and transmitters 240. A receiver and a transmitter may also include other circuits not shown in FIG. 2, such as filters, impedance matching circuits, etc. All or a portion of transceiver 220 may be implemented on one or more analog integrated circuits (ICs), RF ICs (RFICs), mixed-signal ICs, etc. For example, LNAs 234, receive circuits 236a-k, and transmit circuits 242 may be implemented on one circuit module, which may be an RFIC, etc. Switchplexer/duplexer 222, input circuits 232a-k, output circuits 246 a-k, and power amplifiers 244a-k may be implemented on another circuit module, which may be a hybrid module, etc. The circuits in receivers 230 and transmitters 240 may also be implemented in other manners.

Data processor/controller 280 may perform various functions for wireless device 110. For example, data processor 280 may perform processing for data being received via receivers 230 and data being transmitted via transmitters 240. Controller 280 may control the operation of switchplexer/duplexer 222, input circuits 232, LNAs 234, receive circuits 236, transmit circuits 242, power amplifiers 244, output circuits 246, frequency synthesizers 250, or a combination thereof. A memory 282 may store program codes and data for data processor/controller 280. Data processor/controller 280 may be implemented on one or more application specific integrated circuits (ASICs) and/or other ICs.

Figure 3:
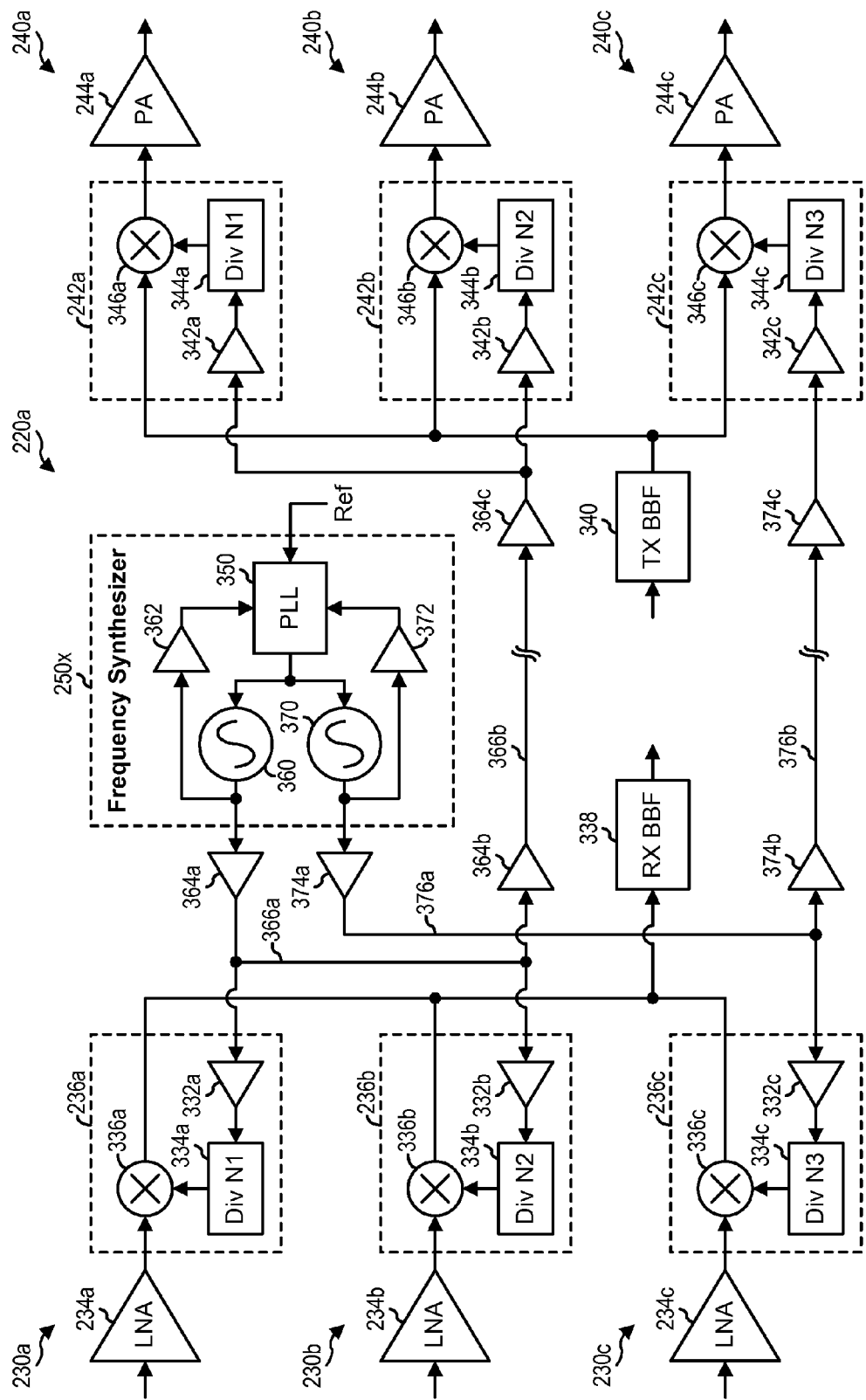
FIG. 3 shows a block diagram of a transceiver with one frequency synthesizer.

FIG. 3 shows a block diagram of a transceiver 220a, which supports TDD with a single frequency synthesizer 250x. Transceiver 220a is one exemplary design of transceiver 220 in FIG. 2. Transceiver 220a includes (i) a receiver 230a and a transmitter 240a for low band, (ii) a receiver 230b and a transmitter 240b for mid band, and (iii) a receiver 230c and a transmitter 240c for high band. Each band covers a particular range of frequencies.

Each receiver 230 includes LNA 234 coupled to receive circuits 236. Receive circuits 236 include a buffer 332, a frequency divider 334, and a downconverter 336. For low band, buffer 332a receives and buffers a VCO signal for low band and provides a buffered VCO signal. Divider 334a divides the buffered VCO signal in frequency by a factor of N and provides a receive LO signal for low band, where N may be any value (e.g., an integer or fractional value). The value of N may be different for each receive circuit 236. For example, divider 334a may be divided by a factor of N1, divider 334b may be divided by a factor of N2 and divider 334c may be divided by a factor of N3. Downconverter 336 downconverts an input RF signal from LNA 234a with the receive LO signal from divider 334a and provides a downconverted signal. A receive baseband filter (RX BBF) 338 filters the downconverted signal and provides an analog input signal. In some configurations, the receive baseband filter 338 includes a lowpass filter (LPF). Receive circuits 236b and 236c for mid band and high band operate in similar manner as receive circuits 236a for low band. Baseband filter 338 is coupled to the outputs of receive circuits 236a, 236b and 236c and is shared by these receive circuits 230.

Each transmitter 240 includes transmit circuits 242 coupled to power amplifier 244. Transmit circuits 242 include a buffer 342, a frequency divider 344, and an upconverter 346. A transmit baseband filter (TX BBF) 340 is coupled to the inputs of transmit circuits 242a, 242b and 242c and is shared by these transmit circuits. In some configurations, the transmit baseband filter 340 includes a lowpass filter (LPF). Baseband filter 340 receives and filters an analog output signal. For low band, buffer 342a receives and buffers the VCO signal for low band and provides a buffered VCO signal. Divider 344a divides the buffered VCO signal in frequency by a factor of N and provides a transmit LO signal for low band. The value of N may be different for each transmit circuit 242. For example, divider 344a may be divided by a factor of N1, divider 344b may be divided by a factor of N2 and divider 344c may be divided by a factor of N3. Upconverter 346a upconverts the filtered signal from baseband filter 340 with the transmit LO signal from divider 344a and provides a modulated RF signal. Power amplifier 244a amplifies the modulated RF signal and provides an amplified RF signal for low band. Transmit circuits 242b and 242c for mid band and high band operate in similar manner as transmit circuits 242a for low band.

In the exemplary design shown in FIG. 3, a single frequency synthesizer 250x generates VCO signals for both receivers 230 and transmitters 240. Within frequency synthesizer 250x, a VCO 360 generates a first VCO signal for either low band or mid band, and a buffer 362 buffers the first VCO signal. A VCO 370 generates a second VCO signal for high band, and a buffer 372 buffers the second VCO signal. A PLL 350 receives the buffered first VCO signal from buffer 362, the buffered second VCO signal from buffer 372, and a reference (Ref) signal at a reference frequency. PLL 350 generates a first control signal for VCO 360 so that the first VCO signal is at a target VCO frequency in low or mid band. PLL 350 also generates a second control signal for VCO 370 so that the second VCO signal is at a target VCO frequency in high band. The control signal generated by the PLL 350 may not be simultaneous. In other words, when the target frequency is in the low/mid bands, only the first control signal may be generated. When the target frequency is in the high band, only the second control signal may be generated. Buffers 364 buffer and drive the first VCO signal for low band and mid band and may be located along a routing trace 366 for the first VCO signal. Buffers 374 buffer and drive the second VCO signal for high band and may be located along a routing trace 376 for the second VCO signal.

FIG. 3 shows an exemplary design of frequency synthesizer 250x. A frequency synthesizer may also be implemented in other manners. For example, a separate VCO may be used for each band. VCOs 360 and 370 may also be replaced with current-controlled oscillators (ICO), numerically controlled oscillators (NCO), etc.

In the exemplary design shown in FIG. 3, a single frequency synthesizer 250x is used to generate VCO signals for both receivers 230 and transmitters 240. When low band or mid band is selected, VCO 360 generates the first VCO signal for receiver 230a or 230b and transmitter 240a or 240b. When high band is selected, VCO 370 generates the second VCO signal for receiver 230c and transmitter 240c.

The circuits for receivers 230 may be located as far as possible from the circuits for transmitters 240 in order to reduce coupling from transmitters 240 to receivers 230. Frequency synthesizer 250x may be located close to receivers 230 and relatively far from transmitters 240. The VCO signals from VCOs 360 and 370 may be provided to transmitters 240 via long routing traces 366 and 376. Buffers 364 and 374 may be placed at regular intervals along routing traces 366 and 376 and used to provide signal drive for the VCO signals.

The use of a single frequency synthesizer 250x for both receivers 230 and transmitters 240 may have various disadvantages. First, routing traces 366 and 376 for the VCO signals may be complicated and long. Buffers 364 and 374 may be placed along routing traces 366 and 376 to drive the VCO signals along these routing traces. Buffers 364 and 374 may be large in order to preserve signal fidelity of the VCO signals for both receivers 230 and transmitters 240, so that the LO signals at downconverters 336 and upconverters 346 can have good waveform. Large buffers 364 and 374 may consume a large amount of current and may also occupy a large area, both of which are undesirable. Furthermore, power grids of buffers 364 and 374 may be complicated and parasitics may be large. This may result in more coupling between receivers 230 and transmitters 240 even in the FDD mode.

Second, performance of transmitters 240 may degrade due to the use of a single frequency synthesizer 250x for both receivers 230 and transmitters 240. Long routing traces 366 and 376 for the VCO signals for transmitters 240 may be more prone to mismatch. Residual sideband (RSB) for transmitters 240 may be poor due to poor matching of long routing traces 366 and 376. Closer placement of frequency synthesizers 250x to receivers 230 may also result in frequency synthesizer 250x being more easily disturbed by dividers 334 due to VCO pulling when dividers 334 are enabled/disabled. This disturbance may result in larger phase error in the transmit LO signal at the beginning of an uplink interval when receive LO circuits are disabled, in TDD mode, for example.

Figure 4:
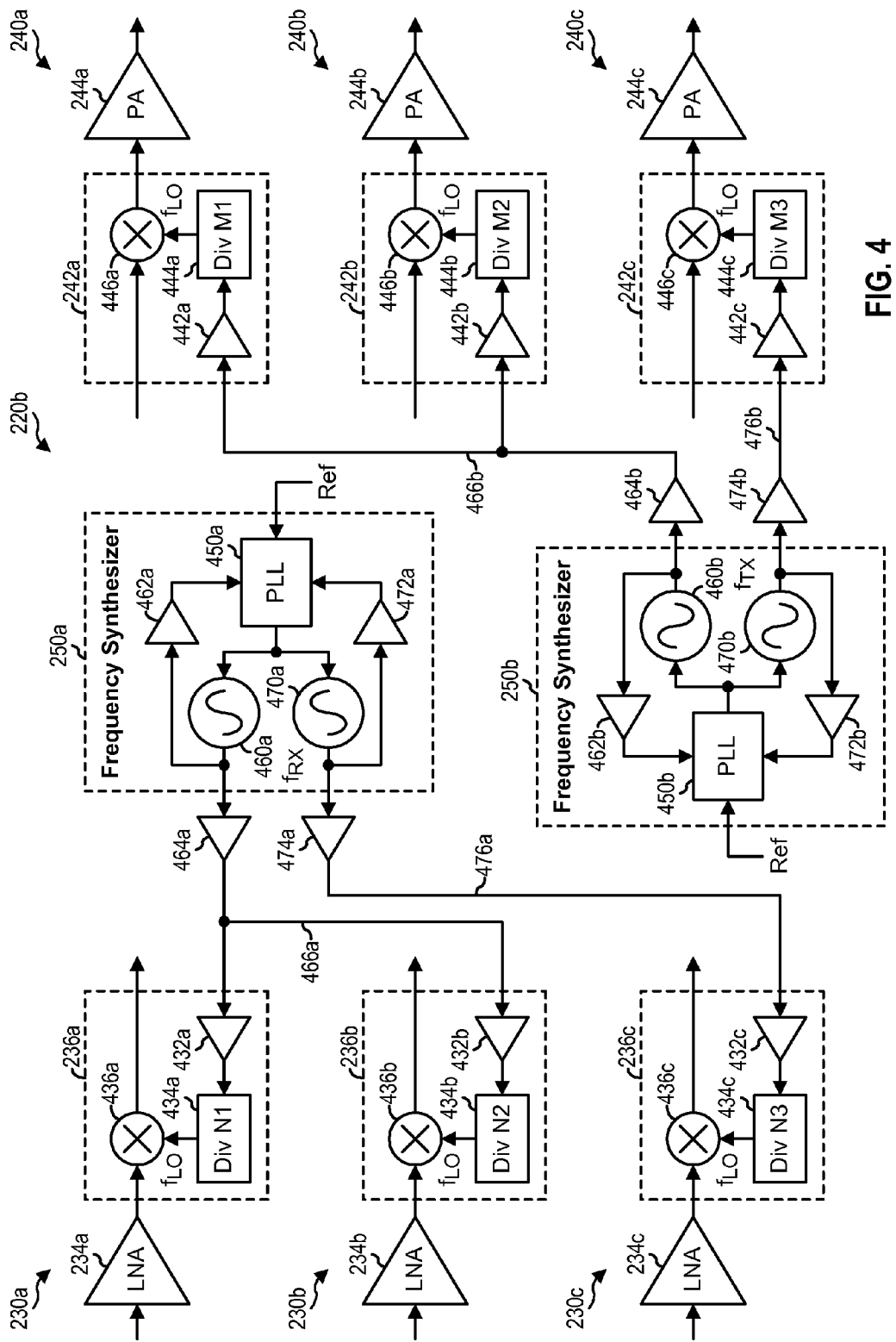
FIG. 4 shows a block diagram of a transceiver with two frequency synthesizers.

FIG. 4 shows a block diagram of a transceiver 220b, which supports TDD with two frequency synthesizers 250a and 250b. Transceiver 220b is another exemplary design of transceiver 220 in FIG. 2. Transceiver 220b includes (i) receiver 230a and transmitter 240a for low band, (ii) receiver 230b and transmitter 240b for mid band, and (iii) receiver 230c and transmitter 240c for high band. Each receiver 230 includes LNA 234 coupled to receive circuits 236. Receive circuits 236 include a buffer 432, a frequency divider 434, and a downconverter 436, which may operate as described above for buffer 332a, frequency divider 334a, and downconverter 336a in FIG. 3. Each transmitter 240 includes transmit circuits 242 coupled to power amplifier 244. Transmit circuits 244 include a buffer 442, a frequency divider 444, and an upconverter 446, which may operate as described above for buffer 342a, frequency divider 344a, and upconverter 346a in FIG. 3.

In the exemplary design shown in FIG. 4, frequency synthesizer 250a generates receive VCO signals for receivers 230, and frequency synthesizer 250b generates transmit VCO signals for transmitters 240. Frequency synthesizer 250a includes a VCO 460a that generates a receive VCO signal for low band or mid band, a VCO 470a that generates a receive VCO signal for high band, a PLL 450a that generates control signals for VCOs 460a and 470a, and buffers 462a and 472a, which may operate in similar manner as described above for VCOs 360 and 370, PLL 350, and buffers 362 and 372 in FIG. 3. Frequency synthesizer 250b includes a VCO 460b that generates a transmit VCO signal for low band or mid band, a VCO 470b that generates a transmit VCO signal for high band, a PLL 450b that generates control signals for VCOs 460b and 470b, and buffers 462b and 472b, which may operate in a similar manner as described above for VCOs 360 and 370, PLL 350, and buffers 362 and 372 in FIG. 3.

A buffer 464a buffers and drives a first receive VCO signal for low band or mid band from VCO 460a. A buffer 474a buffers and drives a second receive VCO signal for high band from VCO 470a. A buffer 464b buffers and drives a first transmit VCO signal for low band or mid band from VCO 460b. A buffer 474b buffers and drives a second transmit VCO signal for high band from VCO 470b.

FIG. 4 shows an exemplary design of frequency synthesizers 250a and 250b. A frequency synthesizer may also be implemented in other manners, as described above.

Within frequency synthesizer 250a, either VCO 460a or 470a may be enabled at any given moment. When operating in low band or mid band, PLL 450a may generate a control signal for VCO 460a so that the first receive VCO signal is at a target VCO frequency in low band or mid band. When operating in high band, PLL 450a may generate a control signal for VCO 470a so that the second receive VCO signal is at a target VCO frequency in high band. Each divider 434 may divide its receive VCO signal in frequency by a factor of N, which may be any suitable value. The value of N may be different for each receive circuit 236. For example, divider 434a may be divided by a factor of N1, divider 434b may be divided by a factor of N2 and divider 434c may be divided by a factor of N3. The frequency of the receive VCO signal may be expressed as:

$$f_{RX} = N * f_{LO}, \quad \text{Eq (1)}$$

where $f_{RX}$ is the frequency of the receive VCO signal, and $f_{LO}$ is the LO frequency, e.g., the center frequency of the received RF signal.

Within frequency synthesizer 250b, either VCO 460b or 470b may be enabled at any given moment. When operating in low band or mid band, PLL 450b may generate a control signal for VCO 460b so that the first transmit VCO signal is at a target VCO frequency in low band or mid band. When operating in high band, PLL 450b may generate a control signal for VCO 470b so that the second transmit VCO signal is at a target VCO frequency in high band. Each divider 434 may divide its transmit VCO signal in frequency by a factor of M, which may be any suitable value. The frequency of the transmit VCO signal may be expressed as:

$$f_{TX} = M * f_{LO}, \quad \text{Eq (2)}$$

where $f_{TX}$ is the frequency of the transmit VCO signal.

As shown in equations (1) and (2), LO signals of the same LO frequency $f_{LO}$ may be provided to receivers 230 and transmitters 240 in the TDD mode. However, divider ratio N for receivers 230 in equation (1) may or may not be equal to divider ratio M for transmitters 240 in equation (2). The use of separate frequency synthesizers 250a and 250b for receivers 230 and transmitters 240 allows for flexibility to use the same or different frequency divider ratios N and M for receivers 230 and transmitters 240. Certain advantages may be obtained by using different frequency divider ratios for receivers 230 and transmitters 240, as described below.

The circuits for receivers 230 may be located as far as possible from the circuits for transmitters 240 in order to reduce coupling from transmitters 240 to receivers 230. Frequency synthesizer 250a may be located close to receivers 230, and frequency synthesizer 250b may be located close to transmitters 240. The receive VCO signals from VCOs 460a and 470a may be provided to receivers 230 via relatively short routing traces 466a and 476a. Similarly, the transmit VCO signals from VCOs 360b and 370b may be provided to transmitters 240 via relatively short routing traces 466b and 476b.

Wireless device 110 may support both TDD and FDD modes. Wireless device 110 may include frequency synthesizers 250a and 250b to generate receive and transmit LO signals at different LO frequencies for receivers 230 and transmitters 240 in the FDD mode. Frequency synthesizers 250a and 250b may be reused and may both be enabled in the TDD mode, which would result in no circuit and area penalty.

Figure 5:
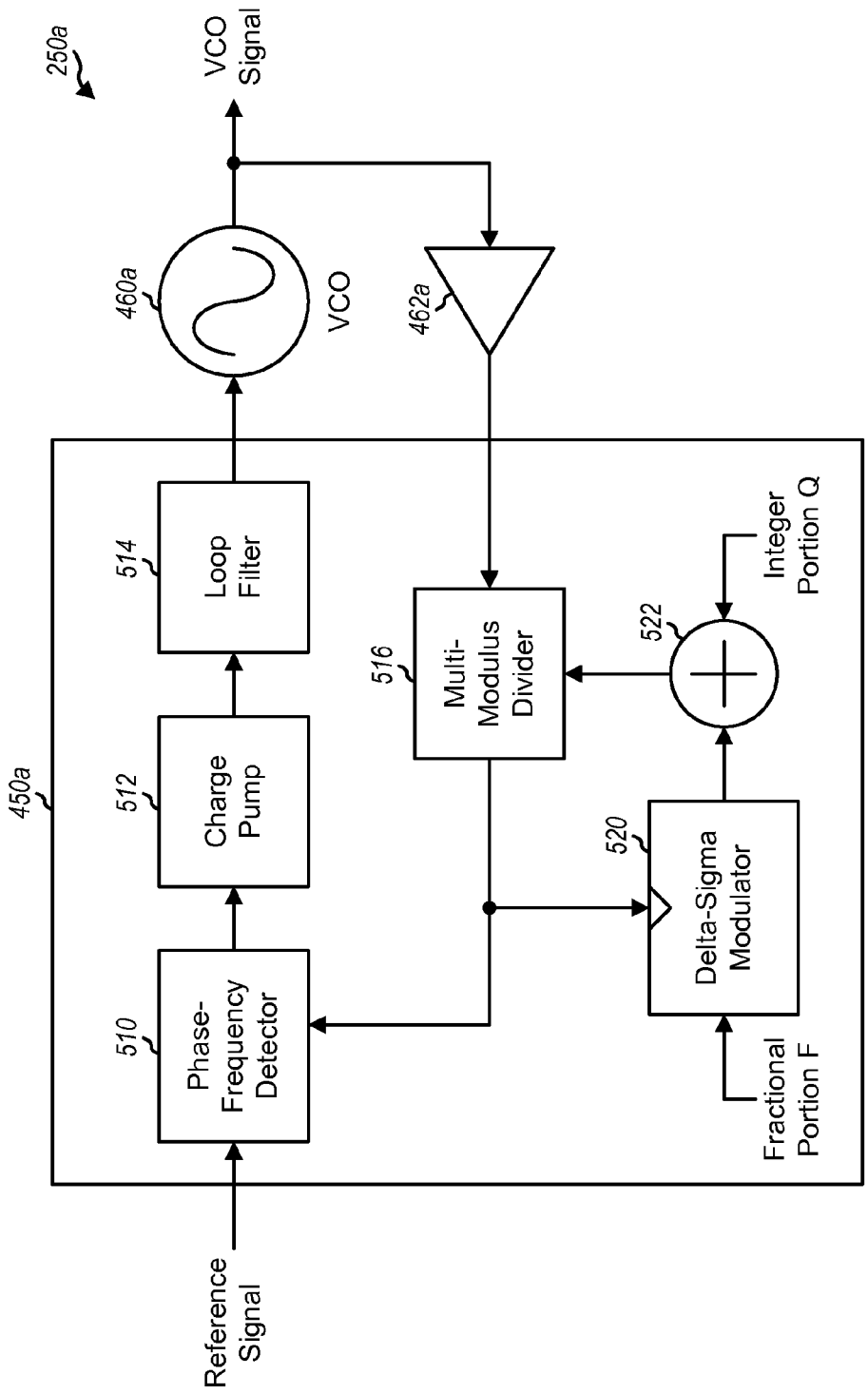
FIG. 5 shows a block diagram of a frequency synthesizer.

FIG. 5 shows a block diagram of an exemplary design of frequency synthesizer 250a in FIG. 4. For simplicity, only VCO 460a and buffer 462a are shown in FIG. 5, and VCO 470a and buffer 472a are omitted for simplicity. Within PLL 450a, a phase-frequency detector 510 receives a reference signal having a precise frequency of $f_{REF}$ and a feedback signal from a multi-modulus divider 516. Detector 510 compares the phase of the feedback signal against the phase of the reference signal and provides an error signal indicative the phase difference/error between the two input signals. A charge pump 512 receives the error signal and generates a current signal (or charge) that is proportional to the error signal. A loop filter 514 filters the current signal and provides a control signal. VCO 460a receives the control signal and generates a VCO signal having a frequency of $f_{RX}$, which is determined by the control signal. Buffer 462a buffers the VCO signal and provides a buffered VCO signal. Divider 516 divides the buffered VCO signal in frequency by a divider ratio of L and provides the feedback signal to phase-frequency detector 510.

The divider ratio L may be a non-integer value and may be decomposed into an integer portion Q and a fractional portion F, where L=Q+F, Q≥1 and 1>F>0. A delta-sigma modulator 520 receives the fractional portion F and generates a bit sequence of ones ('1') and zeros ('0'), with the percentage of ones being dependent on the fractional portion F. However, the ones and zeros are distributed in the bit sequence such that the majority of quantization noise is shaped to appear at high frequency and may be more easily filtered by loop filter 514. A summer 522 sums the bit sequence from delta-sigma modulator 520 with the integer portion Q and provides an instantaneous divider ratio to divider 516. The instantaneous divider ratio may be equal to either Q or Q+1, depending on whether a zero or a one is provided by delta-sigma modulator 520.

Frequency synthesizer 250a may be operated as a fractional-L frequency synthesizer. A fractional divider ratio L may be obtained by changing/dithering the instantaneous divider ratio between integer values of Q and Q+1 at the rate of the reference frequency, where Q is the largest integer value that is less than L. The instantaneous divider ratio can change once per cycle of the reference signal. The average of the instantaneous divider ratio is equal to the fractional divider ratio L. Quantization noise resulting from approximating the fractional divider ratio L with a sequence of integer divider ratios Q and Q+1 may be shaped by delta-sigma modulator 520 to concentrate at high frequencies outside of the closed-loop bandwidth of frequency synthesizer 250a. The quantization noise may then be filtered by the low pass response of frequency synthesizer 250a.

Frequency synthesizer 250a may also be operated as an integer-L frequency synthesizer. In this case, delta-sigma modulator 520 may be removed. Divider 516 may divide the buffered VCO signal in frequency by a fixed integer divider ratio, and the VCO frequency may be an integer multiple of the reference frequency, or $f_{VCO} = L * f_{REF}$.

Frequency synthesizers 250a and 250b may generate VCO signals for receivers 230 and transmitters 240 in the TDD mode. In the TDD mode, the LO frequency for receivers 230 for the downlink is the same as the LO frequency for transmitters 240 for the uplink in a given frame, as shown in equations (1) and (2).

In one exemplary design, frequency synthesizers 250a and 250b may generate VCO signals at the same VCO frequency, so that $f_{RX}=f_{TX}$ and N=M in equations (1) and (2). This design may be used if the transceiver has good receive-transmit isolation.

In another exemplary design, frequency synthesizers 250a and 250b may generate VCO signals at different VCO frequencies, so that $f_{RX} \neq f_{TX}$ and N≠M in equations (1) and (2). This design may be used if the transceiver has poor receive-transmit isolation in order to mitigate VCO pulling, which may be significant when the transmit and receive VCOs (e.g., VCO 360 and VCO 370) oscillate at the same or similar frequency. Since receivers 230 may have more stringent requirements on residual sideband, an integer divider ratio may be used for dividers 434 for receivers 230, and a non-integer divider ratio may be used for dividers 444 for transmitters 240. For example, a divider with a divide ratio of 2 is simpler and may result in better residual sideband performance. For instance, a divider ratio of 2 (or N=2) may be used for receivers 230, and a divider ratio of 1.5 (or M=1.5) may be used for transmitters 240. In this case, the receive VCO signals would have a frequency of $f_{RX}=2*f_{LO}$, and the transmit VCO signals would have a frequency of $f_{TX}=1.5*f_{LO}$. By using a divider ratio of 1.5 (and other integer or non-integer divider ratio) for the transmit VCO signal, VCO signals for multiple bands may be generated with a single VCO (instead of multiple VCOs) with careful frequency planning to cover a wide tuning range. An integer or non-integer divider ratio may be supported by PLL 450a in FIG. 5.

Dual frequency synthesizers 250a and 250b may be used for receivers 230 and transmitters 240 for communication with various wireless systems utilizing TDD. For example, dual frequency synthesizers 250a and 250b may be used for communication with LTE TDD systems, TD-SCDMA systems, etc.

Figure 6A:
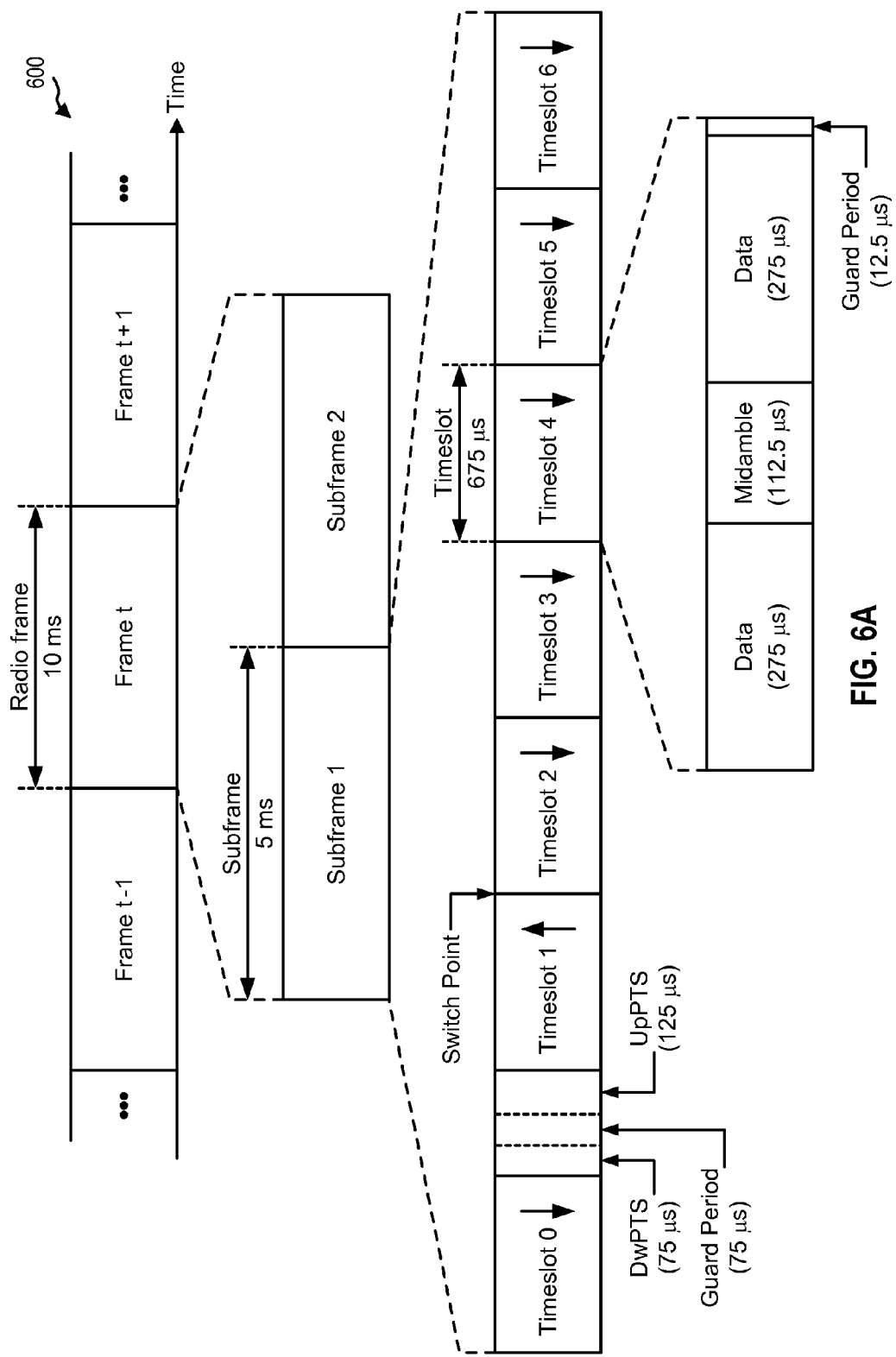
FIGS. 6A and 6B show two frame structures for two wireless systems.

FIG. 6A shows a frame structure 600 for TD-SCDMA. The transmission time line is partitioned into frames, with each frame being identified by a system frame number (SFN). Each frame has a duration of 10 milliseconds (ms) and is partitioned into two subframes 1 and 2. Each subframe has a duration of 5 ms and is partitioned into seven timeslots 0 through 6, a Downlink Pilot Time Slot (DwPTS), an Uplink Pilot Time Slot (UpPTS), and a guard period (GP). The DwPTS, the guard period, and the UpPTS are located after timeslot 0. Timeslot 0 is used for the downlink, timeslot 1 is used for the uplink, and timeslots 2 through 6 may be used for the downlink and/or uplink, as determined by a switch point. In the example shown in FIG. 6A, timeslots 2 to 6 are used for the downlink. Each timeslot has a duration of 675 microsecond (μs) and covers 864 chips. The DwPTS has a duration of 75 μs and covers 96 chips. The UpPTS has a duration of 125 μsec and covers 160 chips. The guard period between the DwPTS and the UpPTS has a duration of 75 μs and covers 96 chips.

Each timeslot includes a first data portion, a midamble, a second data portion, and a guard period. Each data portion has a duration of 275 μs and covers 352 chips. The midamble has a duration of 112.5 μs and covers 144 chips. The guard period at the end of the timeslot has a duration of 12.5 μs and covers 16 chips. Each timeslot may be assigned to one or multiple users for data transmission.

Figure 6B:
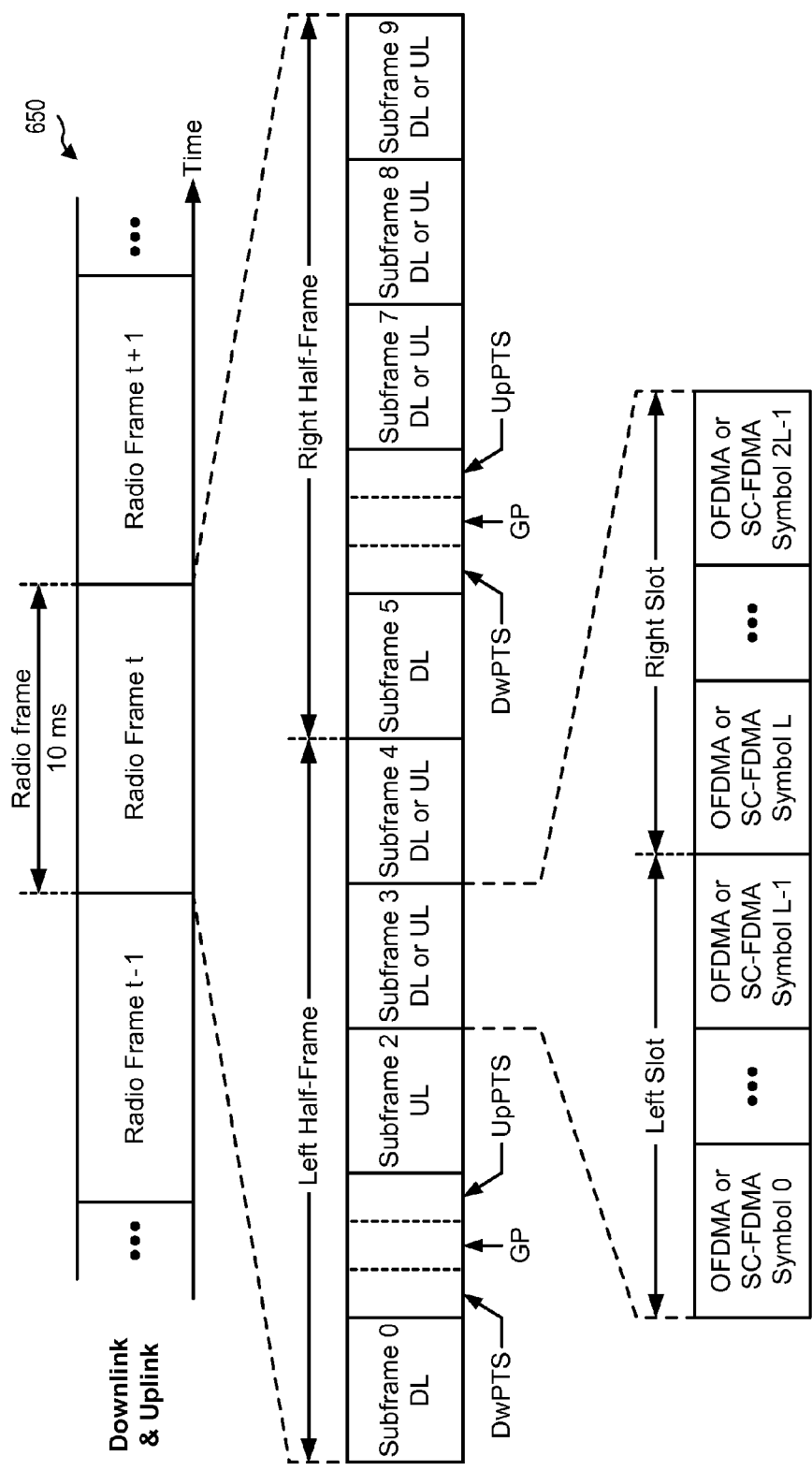

FIG. 6B shows a frame structure 650 for LTE TDD. The transmission timeline is partitioned into units of radio frames, with each radio frame having a duration of 10 ms. Each radio frame is partitioned into 10 subframes with indices of 0 through 9. LTE supports a number of uplink-downlink configurations for TDD. Subframes 0 and 5 are used for the downlink (DL) and subframe 2 is used for the uplink (UL) for all uplink-downlink configurations. Subframes 3, 4, 7, 8 and 9 may each be used for the downlink or uplink depending on the uplink-downlink configuration. Subframe 1 includes three special fields composed of a Downlink Pilot Time Slot (DwPTS) used for downlink control channels as well as data transmission, a Guard Period (GP) of no transmission, and an Uplink Pilot Time Slot (UpPTS) used for either a random access channel (RACH) or a sounding reference signals (SRS). Subframe 6 may include only the DwPTS, or all three special fields, or a downlink subframe depending on the uplink-downlink configuration. The DwPTS, the guard period, and the UpPTS may have different durations for different subframe configurations. The DwPTS may have a duration between 214 and 857 μs. The UpPTS may have a duration between 71 and 142 μs. The guard period may have a duration between 71 and 714 μs.

As shown in FIGS. 6A and 6B, LTE TDD systems and TD-SCDMA systems have fast switching between downlink timeslots and uplink timeslots. For the example in FIG. 6A, within a subframe in a TD-SCDMA system, downlink-to-uplink transition occurs within the 75 μs guard period, and uplink-to-downlink transition occurs within the 12.5 μs guard period at the end of a timeslot.

As shown in FIGS. 6A and 6B, a receiver may be active for only some time intervals, and a transmitter may be active for some other time intervals for communication with a wireless system utilizing TDD. To conserve battery power and possibly improve performance, frequency synthesizer 250a may be enabled when the receiver is active and may be disabled at other times. Similarly, frequency synthesizer 250b may be enabled when the transmitter is active and may be disabled at other times. Frequency synthesizers 250a and 250b may be enabled and disabled based on a power-on sequence.

Figure 7A:
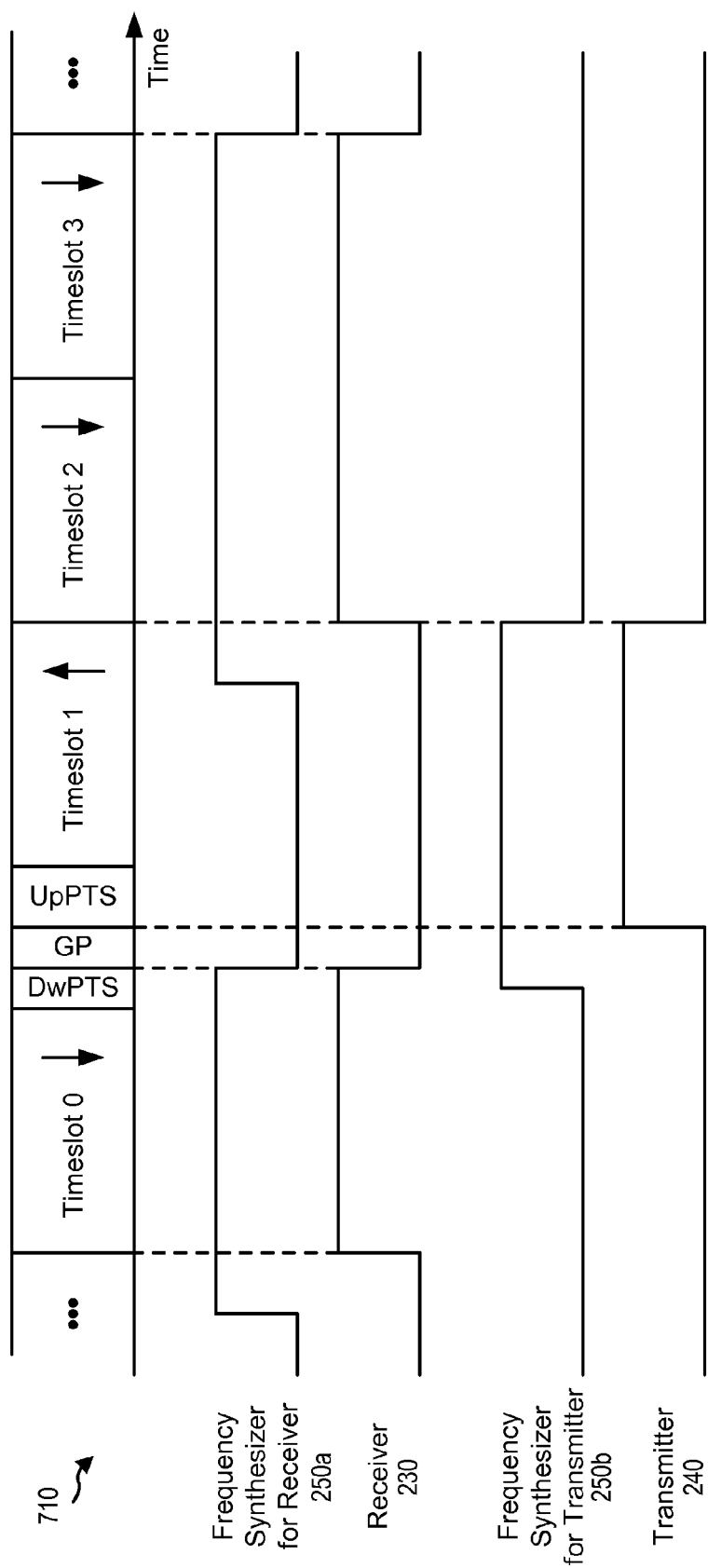
FIGS. 7A to 7D show four power-on sequences for two frequency synthesizers.

FIGS. 7A to 7D show four exemplary power-on sequences for frequency synthesizers 250a and 250b for communication with a TD-SCDMA system. In the examples shown in FIGS. 7A to 7D, wireless device 110 is assigned timeslots 0, 2 and 3 for the downlink and is assigned timeslot 1 for the uplink. One receiver 230 and one transmitter 240 for one band are selected for communication with the TD-SCDMA system. As shown in FIG. 7A, the selected receiver 230 is (i) enabled during timeslot 0 and the DwPTS, (ii) disabled during the guard period, the UpPTS, and timeslot 1, (iii) enabled during timeslots 2 and 3, and (iv) disabled during timeslots 4 to 6. The selected transmitter 240 is (i) disabled during timeslot 0, the DwPTS, and the guard period, (ii) enabled during the UpPTS and timeslot 1, and (iii) disabled during timeslots 2 to 6.

FIG. 7A shows an exemplary power-on sequence 710 for frequency synthesizers 250a and 250b, which is designed to reduce power consumption. For power-on sequence 710, frequency synthesizer 250a is enabled a short time prior to when receiver 230 is enabled and is disabled when receiver 230 is disabled. Similarly, frequency synthesizer 250b is enabled a short time prior to when transmitter 240 is enabled and is disabled when transmitter 240 is disabled. Frequency synthesizers 250a and 250b are enabled sufficiently early in order to warm up and lock to a target VCO frequency prior to when their VCO signals are needed by receiver 230 and transmitter 240. Frequency synthesizers 250a and 250b may be disabled and powered off when not needed to reduce power consumption.

Figure 7B:
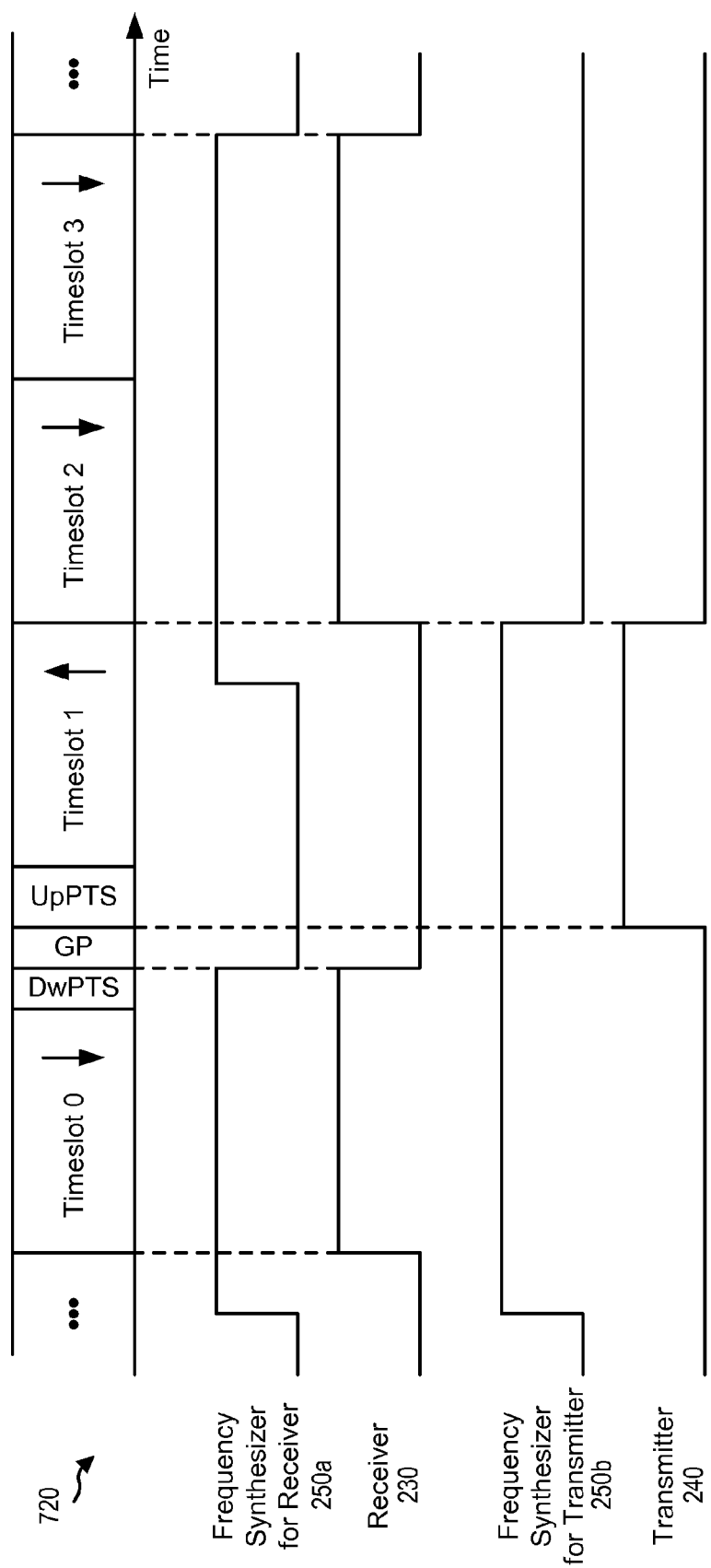

FIG. 7B shows an exemplary power-on sequence 720 for frequency synthesizers 250a and 250b, which is designed to reduce disturbance to receiver 230. High modulation orders may be supported for data transmission on the downlink. Receiver 230 may only be able to tolerate a disturbance resulting in small phase error (e.g., of less than 5 degrees) in the receive VCO signal in order to achieve good performance when demodulating a downlink signal comprising modulation symbols of a high modulation order, e.g., 64 quadrature amplitude modulation (QAM). The phase of the receive VCO signal in frequency synthesizer 250a may change abruptly whenever frequency synthesizer 250b is powered on. Hence, frequency synthesizer 250b may be powered on sufficiently early and not during time intervals when receiver 230 is enabled. In the example shown in FIG. 7B, frequency synthesizer 250b is enabled prior to timeslot 0, e.g., at the same time that frequency synthesizer 250a is enabled. Hence, frequency synthesizer 250b does not disturb the phase of the receive VCO signal in frequency synthesizer 250a during timeslot 0 and the DwPTS. Frequency synthesizer 250b is disabled after timeslot 1, which is the last timeslot assigned to wireless device 110 for the uplink. Similarly, the frequency synthesizer 250a may be powered on sufficiently early and not during time intervals when transmitter 240 is enabled.

In some power-on sequence configurations (not shown), the transmit or receiver frequency synthesizer 250a and 250b may be enabled within the midamble of a timeslot. For example, the transmit or receiver frequency synthesizer 250a and 250b may be enabled within any portion of a data slot. Midamble may use less stringent modulation (e.g., a lower speed of modulation), for example, quadrature phase shift keying (QPSK), than the modulation used in the other portion of a data slot, for example, 64 QAM. Enabling the transmit frequency synthesizer 250a or the receiver frequency synthesizer 250b during the midamble may result in less disturbance and, therefore, less performance degradation. For example, in QPSK, the receiver 230 or transmitter 240 may tolerate larger disturbance by the power-on of the frequency synthesizer 250b. For instance, 64 QAM may be used in the downlink and/or uplink. The transmit frequency synthesizer 250b may still be enabled during the midamble of the downlink to minimize the induced disturbance.

Figure 7C:
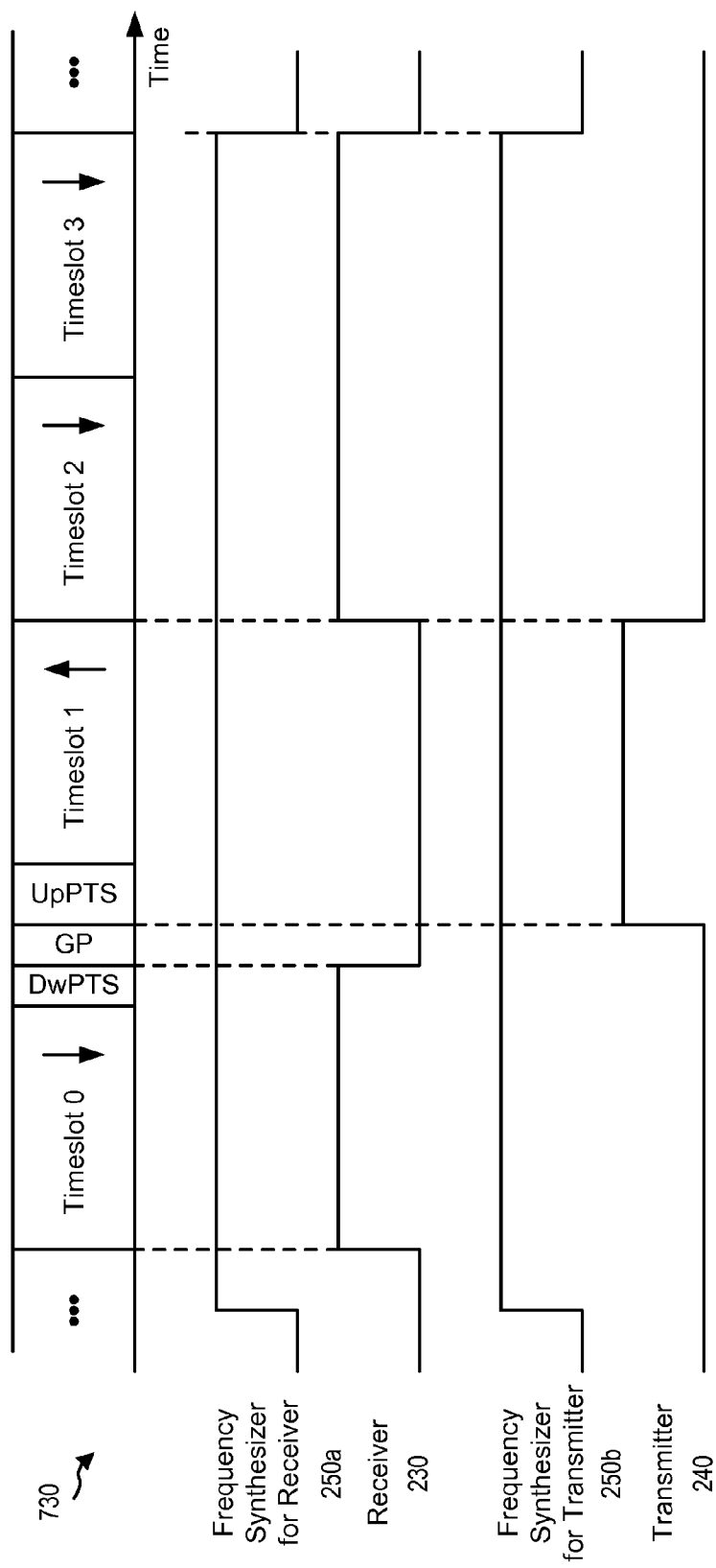

FIG. 7C shows an exemplary power-on sequence 730 for frequency synthesizers 250a and 250b, which is designed to reduce VCO pulling. Isolation between frequency synthesizers 250a and 250b and their signal paths may be dependent on various factors such as total area, layout, and floor plan of transceiver 220. Transceiver 220 may have poor receive-transmit isolation. In this case, VCO pulling may occur, and powering on one frequency synthesizer may disturb the frequency/phase of the other frequency synthesizer. To mitigate VCO pulling due to poor receive-transmit isolation, frequency synthesizers 250a and 250b may be enabled together. In the example shown in FIG. 7C, frequency synthesizers 250a and 250b are both enabled prior to timeslot 0 and disabled at the end of timeslot 3. Receiver 230 is enabled only during timeslots 0, the DwPTS, and timeslots 2 and 3. Transmitter 240 is enabled only during the UpPTS and timeslot 1. Frequency synthesizers 250a and 250b are enabled longer than their associated receiver 230 and transmitter 240, which may result in higher power consumption. However, long routing traces and large buffers for the VCO signals may be avoided by using dual frequency synthesizers 250a and 250b, which may result in lower power consumption and better performance (e.g., better residual sideband) for both receiver 230 and transmitter 240.

Figure 7D:
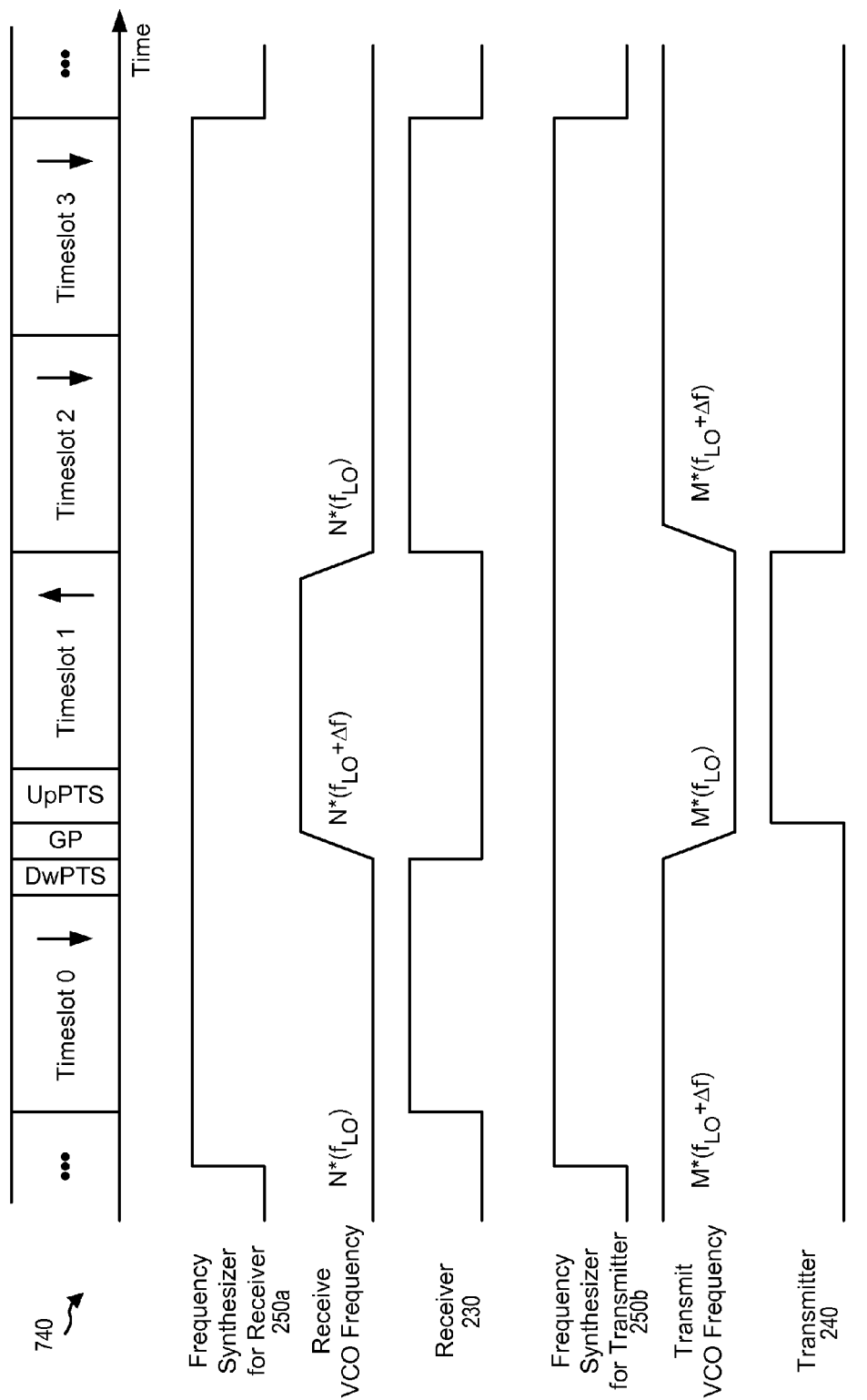

FIG. 7D shows an exemplary power-on sequence 740 for frequency synthesizers 250a and 250b, which is designed to mitigate phase noise degradation. The receive-transmit isolation within transceiver 220 may be poor, and coupling between a receive VCO in frequency synthesizer 250a and a transmit VCO in frequency synthesizer 250b may degrade the phase noise of one another. Furthermore, injection lock may occur when the frequencies of the receive VCO and transmit VCO are too close to each other. Injection lock may cause the phase noise of one VCO (e.g., the receive VCO) overwhelming the phase noise of the other VCO (e.g., the transmit VCO), which results in degradation. In other words, injection locking is a problem because the phase noise of one VCO will overwhelm the phase noise of the other VCO.

In one design of mitigating phase noise degradation, the receive VCO and the transmit VCO may operate at different VCO frequencies, as described above. Different divider ratios may then be used for the receive and transmit VCO signals to obtain receive and transmit LO signals at the desired LO frequency. For example, a divider ratio of N=2 may be used for the receive VCO signal from frequency synthesizer 250a, and a divider ratio of M=1.5 may be used for the transmit VCO signal from frequency synthesizer 250b.

In another design of mitigating phase noise degradation, the receive VCO frequency may be skewed slightly from the transmit VCO frequency so that (i) the receive VCO and the transmit VCO do not operate at the same frequency at any given time and (ii) only the receive VCO or the transmit VCO operate at its target VCO frequency at any given time. In the example shown in FIG. 7D, frequency synthesizers 250a and 250b are both enabled prior to timeslot 0 and are both disabled at the end of timeslot 3. The receive VCO within frequency synthesizer 250a operates at the target VCO frequency of $N*f_{LO}$ during timeslot 0, the DwPTS, and timeslots 2 and 3 when receiver 230 is enabled. The receive VCO operates at a skewed VCO frequency of $N*(f_{LO}+\Delta f)$ during the guard period, the UpPTS, and timeslot 1 when receiver 230 is disabled. The transmit VCO within frequency synthesizer 250b operates at the target VCO frequency of $M*f_{LO}$ during the UpPTS and timeslot 1 when transmitter 240 is enabled. The transmit VCO operates at a skewed VCO frequency of $M*(f_{LO}+\Delta f)$ during timeslot 0, the DwPTS, and timeslots 2 and 3 when transmitter 240 is disabled. The receive VCO and the transmit VCO may switch frequency at the same time (e.g., as shown in FIG. 7D) or at different times (not shown in FIG. 7D).

The receive and transmit VCO frequencies may be skewed in various manners. In one exemplary design, a VCO frequency may be skewed by dynamically adjusting a frequency divider ratio of a PLL (i.e., a synthesizer frequency word) by a small amount without resetting the PLL. For example, the fraction portion F in FIG. 5 may be set to a small value to obtain a small change in the VCO frequency. Only a small deviation in the VCO frequency may be achievable due to a limited frequency dynamic range of a running frequency synthesizer. The settling time of the VCO frequency may be relatively short due to a small change in the VCO frequency. In another exemplary design, a VCO frequency may be skewed via a hard reset of a frequency synthesizer. A hard reset may be accomplished by temporarily powering off the PLL. A hard reset resets the PLL to its initial state (i.e, the state the PLL is in when it first powers on before it locks the first time). In some exemplary designs, a VCO frequency may be skewed via a soft reset of a frequency synthesizer. In a soft reset, the division ratio is changed on the fly and the PLL adjusts to the frequency change, however, no power down is required. A large deviation of the VCO frequency may be achievable albeit with a longer settling time for the VCO frequency.

FIGS. 7A to 7D show four exemplary power-on sequences for two frequency synthesizers for a receiver and a transmitter in the TDD mode. Two frequency synthesizers may also be enabled and disabled in other manners. For example, one frequency synthesizer (e.g., frequency synthesizer 250a) may be enabled all the time, and the other frequency synthesizer may be enabled or disabled as appropriate.

Using separate frequency synthesizers 250a and 250b for receivers 230 and transmitters 240 in the TDD mode may provide various advantages. First, fewer and/or smaller buffers 464 and 474 may be used to drive the VCO signals via shorter distances with less loading. Fewer and/or smaller buffers 464 and 474 may save circuit area and reduce power consumption. Routing traces 466 and 476 for the VCO signals may be shorter, less complicated, and less prone to coupling.

Second, better performance (e.g., better residual sideband) may be achieved for receivers 230 and transmitter 240 due to shorter routing traces 466 and 476 for the VCO signals. Better suppression of phase disturbance to receivers 230 and transmitters 240 may be achieved with appropriate LO frequency plan and power-up sequence of frequency synthesizers 250a and 250b, as described below. Better receive-transmit isolation may also be achieved in both TDD and FDD modes because no switches or buffers are connected between the receive portion and the transmit portion of the transceiver, as shown in FIG. 4. Better receive-transmit isolation may also result in less disturbance, less VCO pulling, and faster switching time for frequency synthesizers 250a and 250b.

Other benefits may also be obtained by using two frequency synthesizers for receivers 230 and transmitters 240 in the TDD mode. For example, since the LO frequency is the same for both receivers 230 and transmitters 240 in a given frame in the TDD mode, no time is needed to relock the VCO frequencies. This result may occur because the frequency synthesizers for receivers 230 and transmitters 240 are both enabled within the uplink and downlink of the same frame, for example. If different divider ratios are used for receivers 230 and transmitters 240, then a smaller VCO tuning range may be possible.

In an exemplary design, an apparatus (e.g., a wireless device, an IC, a circuit module, etc.) may comprise first and second frequency synthesizers. The first frequency synthesizer (e.g., frequency synthesizer 250a in FIG. 4) may generate a first oscillator signal (e.g., a receive VCO signal), which may be used to generate a first LO signal (e.g., a receive LO signal) at an LO frequency for a receiver. The second frequency synthesizer (e.g., frequency synthesizer 250b) may generate a second oscillator signal (e.g., a transmit VCO signal), which may be used to generate a second LO signal (e.g., a transmit LO signal) at the same LO frequency for a transmitter.

The first and second frequency synthesizers may generate the first and second oscillator signals to obtain the first and second LO signals at the same LO frequency when the apparatus operates in a TDD mode. In the TDD mode, the receiver may be enabled during first time intervals, and the transmitter may be enabled during second time intervals. The apparatus may also operate in an FDD mode. In this case, the first and second frequency synthesizers may generate the first and second oscillator signals to obtain the first and second LO signals at different LO frequencies.

In one design, the first and second frequency synthesizers may generate the first and second oscillator signals at the same oscillator/VCO frequency. In this design, the first and second oscillator signals may be divided in frequency by the same divider ratio to obtain the first and second LO signals at the same LO frequency. In another design, the first and second frequency synthesizers may generate the first and second oscillator signals at different oscillator/VCO frequencies. The first oscillator signal may be at a first oscillator frequency, which may be an integer multiple of the LO frequency. The second oscillator signal may be at a second oscillator frequency, which may be different from the first oscillator frequency and may be a non-integer multiple of the LO frequency.

The first and second frequency synthesizers may be enabled and disabled in various manners. In one design that is shown in FIG. 7A, the first frequency synthesizer may be enabled prior to when the receiver is enabled and may be disabled after or when the receiver is disabled. The second frequency synthesizer may be enabled prior to when the transmitter is enabled and may be disabled after or when the transmitter is disabled. In another design that is shown in FIG. 7B, the first and second frequency synthesizers may be enabled prior to when the receiver is enabled. The first frequency synthesizer may be disabled after or when the receiver is disabled. The second frequency synthesizer may be disabled after or when the transmitter is disabled. In yet another design that is shown in FIG. 7C, the first and second frequency synthesizers may be enabled prior to when the receiver is enabled and may be disabled after or when the receiver is disabled. The first and second frequency synthesizers may also be enabled and disabled in other manners.

In one design, the first frequency synthesizer may generate the first oscillator signal at a target oscillator frequency (e.g., $N^*f_{LO}$) when the receiver is enabled and at an offset from the target oscillator frequency (e.g., $N^*(f_{LO}+\Delta f)$) when the transmitter is enabled. The first frequency synthesizer may comprise a PLL, and the offset from the target oscillator frequency may be obtained by changing a frequency divider ratio within the PLL. In one design, the second frequency synthesizer may generate the second oscillator signal at a target oscillator frequency (e.g., $M^*f_{LO}$) when the transmitter is enabled and at an offset from the target oscillator frequency (e.g., $M^*(f_{LO}+\Delta f)$) when the receiver is enabled.

Figure 8:
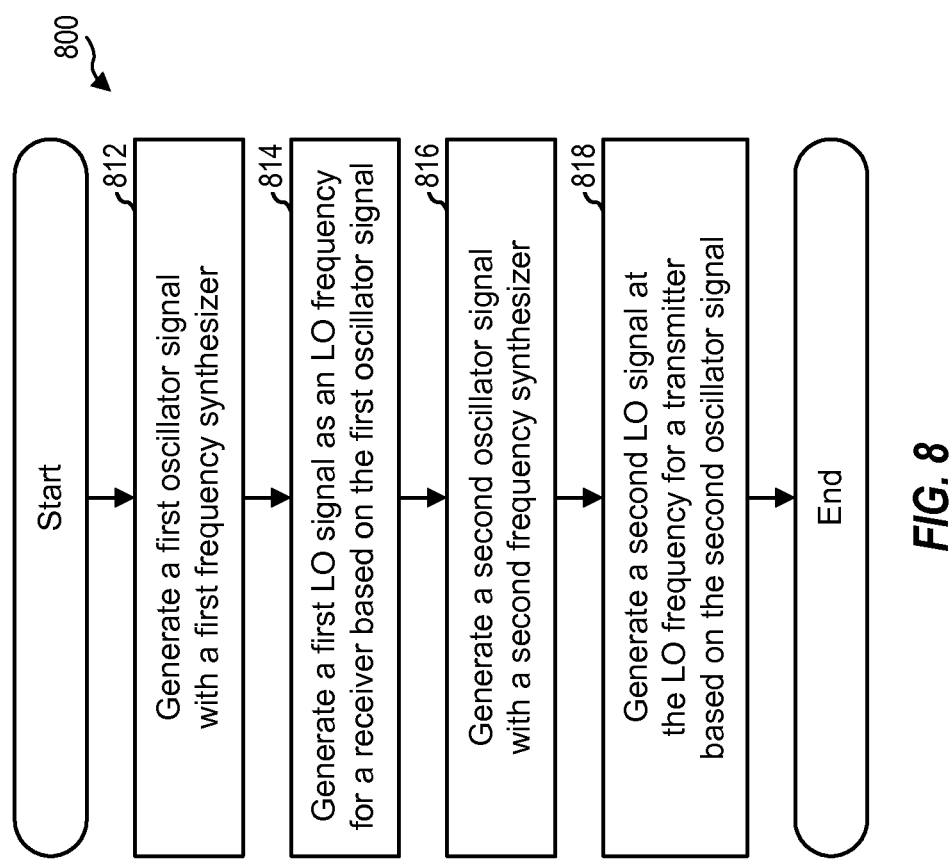
FIG. 8 shows a process for generating LO signals.

FIG. 8 shows an exemplary design of a process 800 for generating LO signals. A first oscillator signal may be generated 812 with a first frequency synthesizer. A first LO signal at an LO frequency for a receiver may be generated 814 based on the first oscillator signal. A second oscillator signal may be generated 816 with a second frequency synthesizer. A second LO signal at the LO frequency for a transmitter may be generated 818 based on the second oscillator signal.

The first frequency synthesizer may generate the first oscillator signal at a first oscillator frequency. The second frequency synthesizer may generate the second oscillator signal at a second oscillator frequency. In one design, the first oscillator frequency may be the same as the second oscillator frequency, and the same frequency divider ratio may be used for the first and second oscillator signals to generate the first and second LO signals. In another design, the first oscillator frequency may be different from the second oscillator frequency. In this design, the first oscillator frequency may be an integer multiple of (e.g., 2 times) the LO frequency, and the second oscillator frequency may be a non-integer multiple of (e.g., 1.5 times) the LO frequency.

The first and second frequency synthesizers may be enabled and disabled in various manners, as described above. The first and second frequency synthesizers may generate the first and second oscillator signals in various manners. In one design, the first and second oscillator signals may be at their target oscillator frequencies all the time. In another design, the first oscillator signal may be at its target oscillator frequency when the receiver is enabled and may be at an offset from its target oscillator frequency when the transmitter is enabled, e.g., as shown in FIG. 7D. The second oscillator signal may be at its target oscillator frequency when the transmitter is enabled and may be at an offset from its target oscillator frequency when the receiver is enabled, e.g., as also shown in FIG. 7D.

Those of skill in the art would understand that information and signals may be represented using any of a variety of different technologies and techniques. For example, data, instructions, commands, information, signals, bits, symbols and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in random access memory (RAM), flash memory, read-only memory (ROM), erasable programmable read only memory (EPROM), electrically erasable programmable read-only memory (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. An apparatus for wireless communication, comprising:
a first frequency synthesizer configured to generate a first oscillator signal used to generate a first local oscillator (LO) signal at an LO frequency for a receiver;
a second frequency synthesizer configured to generate a second oscillator signal used to generate a second LO signal at the LO frequency for a transmitter; and
wherein the first and second frequency synthesizers are configured to generate the first and second oscillator signals to obtain the first and second LO signals at the same LO frequency when the apparatus operates in a time division mode, and wherein at least one of the first and second frequency synthesizers are enabled within the midamble of a data slot, and wherein a lower speed of modulation is used.

2. The apparatus of claim 1, wherein the receiver is enabled during first time intervals and the transmitter is enabled during second time intervals in the time division mode.

3. The apparatus of claim 1, wherein the time division mode is one of a time division duplex (TDD) mode and a time division synchronous code division multiple access (TD-SCDMA) mode.

4. The apparatus of claim 3, wherein the TDD mode is a long term evolution (LTE) TDD mode.

5. The apparatus of claim 1, wherein the first and second frequency synthesizers are configured to generate the first and second oscillator signals at same oscillator frequency.

6. The apparatus of claim 1, wherein the first frequency synthesizer is configured to generate the first oscillator signal at a first oscillator frequency, and wherein the second frequency synthesizer is configured to generate the second oscillator signal at a second oscillator frequency different from the first oscillator frequency.

7. The apparatus of claim 6, wherein the first oscillator frequency is an integer multiple of the LO frequency, and wherein the second oscillator frequency is a non-integer multiple of the LO frequency.

8. The apparatus of claim 6, wherein the first oscillator frequency is a non-integer multiple of the LO frequency, and wherein the second oscillator frequency is an integer multiple of the LO frequency.

9. The apparatus of claim 1, wherein the first frequency synthesizer is enabled prior to when the receiver is enabled and is disabled after or when the receiver is disabled, and wherein the second frequency synthesizer is enabled prior to when the transmitter is enabled and is disabled after or when the transmitter is disabled.

10. The apparatus of claim 1, wherein the first and second frequency synthesizers are enabled prior to when the receiver is enabled, wherein the first frequency synthesizer is disabled after or when the receiver is disabled, and wherein the second frequency synthesizer is disabled after or when the transmitter is disabled.

11. The apparatus of claim 1, wherein the first and second frequency synthesizers are enabled prior to when the transmitted is enabled.

12. The apparatus of claim 1, wherein the first and second frequency synthesizers are enabled prior to when the receiver is enabled and are disabled after or when the receiver is disabled.

13. The apparatus of claim 1, wherein the first and second frequency synthesizers are enabled prior to when the transmitter is enabled, and wherein the first and second frequency are disabled after or when the transmitter is disabled.

14. The apparatus of claim 1, wherein the first frequency synthesizer is configured to generate the first oscillator signal at a target oscillator frequency when the receiver is enabled and at an offset from the target oscillator frequency when the transmitter is enabled.

15. The apparatus of claim 14, wherein the first frequency synthesizer comprises a phase locked loop (PLL), and wherein the offset from the target oscillator frequency is obtained by changing a frequency divider ratio within the PLL.

16. The apparatus of claim 1, wherein the second frequency synthesizer is configured to generate the second oscillator signal at a target oscillator frequency when the transmitter is enabled and at an offset from the target oscillator frequency when the receiver is enabled.

17. A method of generating local oscillator (LO) signals, comprising:
generating a first oscillator signal at a first oscillator frequency with a first frequency synthesizer;
generating a first LO signal at an LO frequency for a receiver based on the first oscillator signal;
generating a second oscillator signal at a second oscillator frequency with a second frequency synthesizer, wherein the second oscillator signal frequency is different from the first oscillator frequency when operating in a time division mode;
generating a second LO signal at the LO frequency for a transmitter based on the second oscillator signal;
enabling at least one of the first and second frequency synthesizers within the midamble of a data slot; and
using a lower speed of modulation.

18. The method of claim 17, wherein the time division mode is one of a time division duplex (TDD) mode and a time division synchronous code division multiple access (TD-SCDMA) mode.

19. The method of claim 18, wherein the TDD mode is a long term evolution (LTE) TDD mode.

20. The method of claim 18, further comprising:
enabling the receiver during first time intervals in the TDD mode; and
enabling the transmitter during second time intervals in the TDD mode.

21. The method of claim 17, wherein the first oscillator frequency is an integer multiple of the LO frequency, and wherein the second oscillator frequency is a non-integer multiple of the LO frequency.

22. The method of claim 17, wherein the first oscillator frequency is a non-integer multiple of the LO frequency, and wherein the second oscillator frequency is an integer multiple of the LO frequency.

23. The method of claim 17, further comprising:
enabling the first frequency synthesizer prior to when the receiver is enabled;
disabling the first frequency synthesizer after or when the receiver is disabled;
enabling the second frequency synthesizer prior to when the transmitter is enabled; and
disabling the second frequency synthesizer after or when the transmitter is disabled.

24. The method of claim 17, further comprising:
enabling the first and second frequency synthesizers prior to when the receiver is enabled;
disabling the first frequency synthesizer after or when the receiver is disabled; and
disabling the second frequency synthesizer after or when the transmitter is disabled.

25. The method of claim 17, further comprising:
enabling the first and second frequency synthesizers prior to when the transmitter is enabled.

26. The method of claim 17, further comprising:
enabling the first and second frequency synthesizers prior to when the receiver is enabled; and
disabling the first and second frequency synthesizers after or when the receiver is disabled.

27. The method of claim 17, further comprising:
enabling the first and second frequency synthesizers prior to when the transmitter is enabled; and
disabling the first and second frequency synthesizers after or when the transmitter is disabled.

28. The method of claim 17, wherein generating the first oscillator signal comprises:
generating the first oscillator signal at a target oscillator frequency when the receiver is enabled, and
generating the first oscillator signal at an offset from the target oscillator frequency when the transmitter is enabled.

29. An apparatus for wireless communication, comprising:
means for generating a first oscillator signal at a first oscillator frequency;
means for generating a first local oscillator (LO) signal at an LO frequency for a receiver based on the first oscillator signal;

means for generating a second oscillator signal at a second oscillator frequency different from the first oscillator frequency when operating in a time division mode;
means for generating a second LO signal at the LO frequency for a transmitter based on the second oscillator signal;
means for enabling at least one of the first and second frequency synthesizers within the midamble of a data slot; and
means for using a lower speed of modulation.

30. The apparatus of claim 29, wherein the time division mode is one of a time division duplex (TDD) mode and a time division synchronous code division multiple access (TD-SCDMA) mode.

31. The apparatus of claim 30, wherein the TDD mode is a long term evolution (LTE) TDD mode.

32. The apparatus of claim 30, further comprising:
means for enabling the receiver during first time intervals in the TDD mode; and
means for enabling the transmitter during second time intervals in the TDD mode.

33. The apparatus of claim 29, wherein the first oscillator frequency is an integer multiple of the LO frequency, and wherein the second oscillator frequency is a non-integer multiple of the LO frequency.

34. The apparatus of claim 29, wherein the first oscillator frequency is a non-integer multiple of the LO frequency, and wherein the second oscillator frequency is an integer multiple of the LO frequency.

35. The apparatus of claim 29, further comprising:
means for enabling the means for generating the first oscillator signal prior to when the receiver is enabled;
means for disabling the means for generating the first oscillator signal after or when the receiver is disabled;
means for enabling the means for generating the second oscillator signal prior to when the transmitter is enabled; and
means for disabling the means for generating the second oscillator signal after or when the transmitter is disabled.

36. The apparatus of claim 29, further comprising:
means for enabling the means for generating the first oscillator signal and the means for generating the second oscillator signal prior to when the receiver is enabled;
means for disabling the means for generating the first oscillator signal after or when the receiver is disabled; and
means for disabling the means for generating the second oscillator signal after or when the transmitter is disabled.

37. The apparatus of claim 29, further comprising:
means for enabling the first and second frequency synthesizers prior to when the transmitter is enabled.

38. The apparatus of claim 29, further comprising:
means for enabling the means for generating the first oscillator signal and the means for generating the second oscillator signal prior to when the receiver is enabled; and
means for disabling the means for generating the first oscillator signal and the means for generating the second oscillator signal after or when the receiver is disabled.

39. The apparatus of claim 29, further comprising:
means for enabling the first and second frequency synthesizers prior to when the transmitter is enabled; and
means for disabling the first and second frequency synthesizers after or when the transmitter is disabled.

40. The apparatus of claim 29, wherein the means for generating the first oscillator signal comprises:
means for generating the first oscillator signal at a target oscillator frequency when the receiver is enabled, and
means for generating the first oscillator signal at an offset from the target oscillator frequency when the transmitter is enabled.

41. A computer program product, comprising:
a non-transitory computer-readable medium comprising:
code for causing at least one processor to direct generation of a first oscillator signal at a first oscillator frequency with a first frequency synthesizer, the first oscillator signal being used to generate a first local oscillator (LO) signal at an LO frequency for a receiver;
code for causing the at least one processor to direct generation of a second oscillator signal at a second oscillator frequency with a second frequency synthesizer, the second oscillator signal being used to generate a second LO signal at the LO frequency for a transmitter, wherein the second oscillator signal frequency is different from the first oscillator frequency when operating in a time division mode;
code for causing at least one processor to enable at least one of the first and second frequency synthesizers within the midamble of a data slot; and
code for causing at least one processor to use a lower speed of modulation.

42. The computer program product of claim 41, wherein the time division mode is one of a time division duplex (TDD) mode and a time division synchronous code division multiple access (TD-SCDMA) mode.

43. The computer program product of claim 42, further comprising:
code for causing at least one processor to enable the receiver during first time intervals in the TDD mode; and
code for causing at least one processor to enable the transmitter during second time intervals in the TDD mode.

44. The computer program product of claim 42, wherein the TDD mode is a long term evolution (LTE) TDD mode.

45. The computer program product of claim 41, further comprising:
code for causing at least one processor to enable the first frequency synthesizer prior to when the receiver is enabled;
code for causing at least one processor to disable the first frequency synthesizer after or when the receiver is disabled;
code for causing at least one processor to enable the second frequency synthesizer prior to when the transmitter is enabled; and
code for causing at least one processor to disable the second frequency synthesizer after or when the transmitter is disabled.

46. The computer program product of claim 41, further comprising:
code for causing at least one processor to enable the first and second frequency synthesizers prior to when the transmitter is enabled.

47. The computer program product of claim 41, further comprising:
code for causing at least one processor to enable the first and second frequency synthesizers prior to when the transmitter is enabled; and
code for causing at least one processor to disable the first and second frequency synthesizers after or when the transmitter is disabled.

* * * * *